United States Patent
Hertkorn et al.

(10) Patent No.: US 9,502,607 B2
(45) Date of Patent: Nov. 22, 2016

(54) METHOD FOR PRODUCING AN ACTIVE ZONE FOR AN OPTOELECTRONIC SEMICONDUCTOR CHIP AND OPTOELECTRONIC SEMICONDUCTOR CHIP

(71) Applicant: OSRAM Opto Semiconductors GmbH, Regensburg (DE)

(72) Inventors: Joachim Hertkorn, Alteglofsheim (DE); Thomas Lehnhardt, Regensburg (DE); Marcus Eichfelder, Regensburg (DE); Jan-Philipp Ahl, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 41 days.

(21) Appl. No.: 14/404,444

(22) PCT Filed: May 3, 2013

(86) PCT No.: PCT/EP2013/059242
§ 371 (c)(1),
(2) Date: Nov. 26, 2014

(87) PCT Pub. No.: WO2013/178425
PCT Pub. Date: Dec. 5, 2013

(65) Prior Publication Data
US 2015/0108426 A1    Apr. 23, 2015

(30) Foreign Application Priority Data
May 30, 2012 (DE) .......... 10 2012 104 671

(51) Int. Cl.
*H01L 33/32* (2010.01)
*H01L 33/00* (2010.01)
*H01L 33/06* (2010.01)

(52) U.S. Cl.
CPC ....... *H01L 33/0075* (2013.01); *H01L 33/0025* (2013.01); *H01L 33/06* (2013.01); *H01L 33/32* (2013.01)

(58) Field of Classification Search
CPC ....... H01L 33/00; H01L 33/06; H01L 33/32; H01L 33/0075; H01L 33/0025
See application file for complete search history.

(56) References Cited

U.S. PATENT DOCUMENTS 7,808,010 B2   10/2010  Lee
7,955,881 B2    6/2011  Akita et al.
(Continued)

FOREIGN PATENT DOCUMENTS

CN    1460729 A    12/2003
CN  101027791 A     8/2007
(Continued)

OTHER PUBLICATIONS

Chung, H. et al, "Improved performance of GAN-based blue light emitting diodes with InGaN/GaN multilayer barriers", Applied Physics Letters, vol. 95, No. 24, 2009, ID 241109, 3 pages.

*Primary Examiner* — Fazli Erdem
(74) *Attorney, Agent, or Firm* — McDermott Will & Emery LLP

(57) ABSTRACT

In at least one embodiment, the method is designed to produce an active zone for an optoelectronic semiconductor chip and comprises the following steps: growing a fourth barrier layer (24) based on $Al_{x4}In_{y4}Ga_{1-x4-y4}N$ where $0 \leq x4 \leq 0.40$ and on average $0 < y4 \leq 0.4$, wherein the In content increases along a growth direction (z), growing a quantum well layer (20) on the fourth barrier layer (24), wherein the quantum well layer (20) is based on $In_yGa_{1-y}N$ where $0.08 \leq y \leq 0.35$, growing a first barrier layer (21) based on $Al_{x1}In_{y1}Ga_{1-x1-y1}N$ where $0 \leq x1 \leq 0.40$ and on average $0 < y1 \leq 0.4$ onto the quantum well layer (20), wherein the In content decreases along the growth direction (z), growing a second barrier layer (22) based on GaN onto the first barrier layer (21), and growing a third barrier layer (23) based on GaN onto the second barrier layer (22), wherein the third barrier layer (23) is grown with the addition of $H_2$ gas.

18 Claims, 2 Drawing Sheets

(56) References Cited

U.S. PATENT DOCUMENTS

Figure 1:
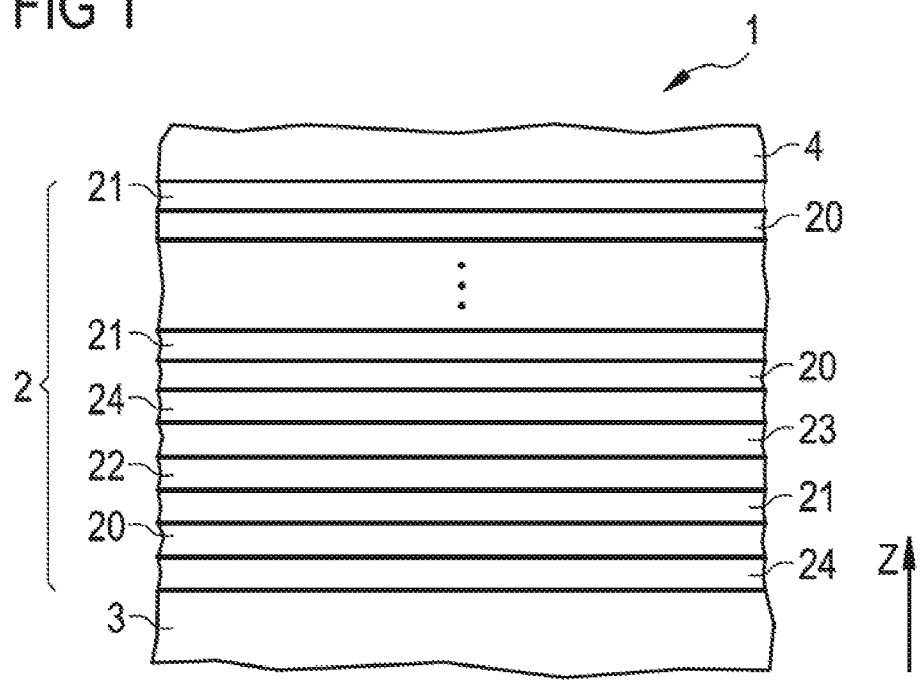

| | | | |
|---|---|---|---|
| 2005/0199903 A1* | 9/2005 | Kyono | B82Y 20/00 257/103 |
| 2005/0236642 A1 | 10/2005 | Sakai et al. | |
| 2008/0023689 A1* | 1/2008 | Kim | B82Y 20/00 257/13 |
| 2008/0093610 A1 | 4/2008 | Lee | |
| 2008/0258135 A1 | 10/2008 | Hoke et al. | |
| 2009/0224226 A1 | 9/2009 | Huang et al. | |
| 2009/0278113 A1 | 11/2009 | Chung et al. | |
| 2010/0150194 A1* | 6/2010 | Tsuchiya | B82Y 20/00 372/45.01 |
| 2010/0187495 A1* | 7/2010 | Yoon | H01L 21/0237 257/13 |
| 2010/0320441 A1 | 12/2010 | Lee | |
| 2011/0042646 A1* | 2/2011 | Ohta | B82Y 20/00 257/14 |
| 2011/0147702 A1 | 6/2011 | Tansu et al. | |
| 2011/0197808 A1 | 8/2011 | Shioda et al. | |
| 2011/0198583 A1 | 8/2011 | Nago et al. | |
| 2011/0204328 A1 | 8/2011 | Tansu et al. | |
| 2011/0206081 A1 | 8/2011 | Kasugai et al. | |
| 2014/0045289 A1* | 2/2014 | Nago | H01L 33/0075 438/47 |

FOREIGN PATENT DOCUMENTS

| | | |
|---|---|---|
| CN | 101777613 A | 7/2010 |
| CN | 102301548 A | 12/2011 |
| EP | 1883122 A2 | 1/2008 |
| JP | H1084132 A | 3/1998 |
| JP | H10242512 A | 9/1998 |
| JP | H1126812 A | 1/1999 |
| JP | 2007088270 A | 4/2007 |
| JP | 2008118049 A | 5/2008 |
| JP | 2010251612 A | 11/2010 |
| JP | 2011166031 A | 8/2011 |
| JP | 2011171445 A | 9/2011 |
| TW | I232601 B | 5/2005 |
| TW | 200832758 A | 8/2008 |
| TW | 200910589 A | 3/2009 |
| TW | 201021123 A | 6/2010 |
| WO | WO-2006022497 A1 | 3/2006 |

\* cited by examiner

METHOD FOR PRODUCING AN ACTIVE ZONE FOR AN OPTOELECTRONIC SEMICONDUCTOR CHIP AND OPTOELECTRONIC SEMICONDUCTOR CHIP

A method is provided for producing an active zone for an optoelectronic semiconductor chip. A corresponding semiconductor chip is additionally provided.

A problem addressed is to provide an optoelectronic semiconductor chip with elevated high-current linearity.

This problem is solved inter alia by a method and by an optoelectronic semiconductor chip having the features of the independent claims. Preferred further developments constitute the subject matter of the dependent claims.

According to at least one embodiment, the method comprises the step of providing a growth basic layer for the active zone. The growth basic layer is for example a superlattice with alternating layers of GaN and InGaN. The GaN layers and/or the InGaN layers may each be doped, for example n-doped. The superlattice is for example grown on further, in particular n-conductive layers such as current spreading layers, buffer layers, seed layers and/or masking layers. Preferably the growth basic layer is a top GaN layer of the superlattice.

According to at least one embodiment, the method comprises the step of growing a fourth barrier layer. This barrier layer is grown in particular directly onto the growth basic layer or onto a third barrier layer. The fourth barrier layer is based on $Al_{x4}In_{y4}Ga_{1-x4-y4}N$, wherein $0 \leq x4 \leq 0.40$ and, averaged over the fourth barrier layer, $0 \leq y4 \leq 0.4$. Where $x4 \leq 0.01$ or $x4=0$, preferably $0 < y4 \leq 0.15$. As also with all the other barrier layers, the fourth barrier layer is preferably undoped. Foreign atoms are then present in particular in a concentration of at most $5 \times 10^{-16}$ cm$^{-3}$. It is alternatively also possible for the fourth barrier layer to be doped, optionally also like the other barrier layers.

According to at least one embodiment, the fourth barrier layer is grown with a gradient in terms of indium content. The indium content in this case increases on average along a growth direction, i.e. the parameter y4 becomes greater along the growth direction.

According to at least one embodiment, the method comprises the step of growing a quantum well layer on the fourth barrier layer. In particular, the quantum well layer is grown directly onto the fourth barrier layer. The quantum well layer is based on $In_yGa_{1-y}N$. Here preferably $0.08 \leq y \leq 0.35$ or $0.08 \leq y \leq 0.3$ is true. The term quantum well layer does not entail any restriction in terms of dimensionality. The quantum well layer preferably takes the form of a two-dimensional quantum well. When the finished optoelectronic semiconductor chip is in operation, the quantum well layer is designed to generate radiation in particular in the ultraviolet and/or blue and/or green spectral range.

According to at least one embodiment, the method includes the step of growing a first barrier layer. The first barrier layer is preferably grown directly onto the quantum well layer. The first barrier layer is based on $Al_{x1}In_{y1}Ga_{1-x1-y1}N$, wherein $0 \leq x1 \leq 0.4$ and, averaged over the first barrier layer, $0 < y1 \leq 0.15$. In the case of $x1 \leq 0.01$ or $x1=0$, $0 < y1 \leq 0.15$ preferably applies. The indium content particularly preferably decreases on average along the growth direction.

According to at least one embodiment, a second barrier layer is preferably grown directly onto the first barrier layer. The second barrier layer is based on GaN.

According to at least one embodiment of the method, a third barrier layer is grown. The third barrier layer is in particular grown directly onto the second barrier layer. The third barrier layer is based on GaN.

According to at least one embodiment of the method, the third barrier layer is grown with the addition of $H_2$ gas. In other words, hydrogen gas is present in the growth reactor during growth of the third barrier layer. The hydrogen gas is preferably added solely during growth of the third barrier layer. Growth of the first, second and fourth barrier layers and the quantum well layer thus preferably takes place without the addition of hydrogen gas.

The term growth relates in particular to epitaxial growth, preferably metalorganic vapour phase epitaxy or MOVPE for short.

In at least one embodiment, the method for producing an active zone is designed for an optoelectronic semiconductor chip. The method comprises at least or solely the following steps, preferably in the stated sequence:

growing a fourth barrier layer based on $Al_{x4}In_{y4}Ga_{1-x4-y4}N$ where $0 \leq x4 \leq 0.40$ and on average $0 < y4 \leq 0.4$, wherein the In content preferably increases along a growth direction, growing a quantum well layer on the fourth barrier layer, wherein the quantum well layer is based on $In_yGa_{1-y}N$ where $0.08 \leq y \leq 0.35$, growing a first barrier layer based on $Al_{x1}In_{y1}Ga_{1-x1-y1}N$ where $0 \leq x1 \leq 0.40$ and on average $0 < y1 \leq 0.4$ onto the quantum well layer, wherein the In content preferably decreases along the growth direction, growing a second barrier layer based on GaN onto the first barrier layer, and growing a third barrier layer based on GaN onto the second barrier layer, wherein the third barrier layer is grown with the addition of $H_2$ gas.

In light-emitting diodes based on the material system AlInGaN, at operating current densities of >10 A/cm$^2$ in particular pronounced non-linearities occur in the current-power characteristic. This phenomenon is also known as "efficiency droop". One cause of efficiency droop is that III-nitrides are piezoelectric materials. The resultant electric fields lead to the "quantum-confined Stark effect". This effect may disadvantageously impair charge carrier transport in a light-emitting diode, in particular in the case of a multiple quantum well structure.

Through the comparatively complex multilayer structure of the barrier between the quantum well layers, comprising in particular precisely four sublayers, the high-current linearity of an optoelectronic semiconductor chip produced in this way is improved. Specifically, a highly indium-free and thus pure, high-quality GaN layer can be achieved as the third barrier layer through the addition of hydrogen gas. This improves the quality of the layers grown thereafter.

According to at least one embodiment of the method, the four barrier layers and the quantum well layer are repeated several times in the stated growth sequence and in particular are grown directly on one another. For example, the active zone comprises at least three or at least four quantum well layers with associated barrier layers. Alternatively or in addition, the number of quantum well layers amounts to at most ten or at most eight.

According to at least one embodiment of the method, an $H_2$ flow rate during growth of the third barrier layer amounts to at least 15% or at least 20% or at least 25% of a flow rate of a reactant gas for N. Alternatively or in addition, the $H_2$ flow rate amounts to at most 55% or at most 50% or at most 40% of the flow rate of the reactant gas for N. The flow rate is here determined in particular in standard litres per minute, abbreviated as slpm or indeed slm. The flow rate is also known as "volumetric gas flow rate". The flow rate is a measure of the quantity of molecules added per unit time and under standard conditions during growth. The reactant gas for N is preferably $NH_3$. $N_2H_4$ may likewise be used.

According to at least one embodiment, the first and the fourth barrier layers each have an average thickness of at least 0.5 nm or at least 0.6 nm or at least 0.7 nm. Alternatively or in addition, the average thickness of the first and fourth barrier layers amounts to at most 1.8 nm or at most 1.4 nm or at most 1.2 nm. In particular, this average thickness amounts roughly to 0.8 nm to 0.9 nm, corresponding to roughly 4+/−1 atomic layers.

According to at least one embodiment, an average thickness of the second and third barrier layers amounts in each case to at least 0.5 nm or at least 0.7 nm or at least 0.8 nm. Alternatively or in addition, this average thickness amounts to at most 2.0 nm or at most 1.8 nm or at most 1.4 nm. In particular, this average thickness is roughly 1.0 nm or roughly 1.1 nm, corresponding to roughly 5+/−1 atomic layers.

According to at least one embodiment, the third barrier layer is grown to have a larger average thickness than the second barrier layer. The difference in the average thicknesses of the second and third barrier layers is for example at least 0.1 nm or at least 0.15 nm and alternatively or additionally at most 0.5 nm or at most 0.3 nm. In particular, the average difference in thicknesses amounts to one atomic layer.

According to at least one embodiment of the method, the quantum well layer has an average thickness of at least 2.5 nm or of at least 2.7 nm or of at least 2.9 nm. Alternatively or in addition, the average thickness of the quantum well layer amounts to at most 4.5 nm or at most 4.0 nm or at most 3.7 nm.

According to at least one embodiment, a total thickness, composed of the thicknesses of the quantum well layer and the four barrier layers, is at least 5.5 nm or at least 6.0 nm. Alternatively or in addition, the total thickness amounts to at most 8.5 nm or at most 7.5 nm.

According to at least one embodiment, the parameters $x1$ and/or $x4$ are in each case less than or equal to 0.02 or less than or equal to 0.01. In particular, the parameters $x1$ and $x4$ may in each case be equal to 0, within the bounds of manufacturing tolerances, such that aluminium concentration is then preferably at most $2 \times 10^{16}$ cm$^{-3}$.

According to at least one embodiment, the parameters $y1$ and $y4$ are in each case at least 0.01 or at least 0.02 or at least 0.04. Alternatively or in addition, the parameters $y1$ and $y4$ amount to at most 0.20 or at most 0.15 or at most 0.11.

According to at least one embodiment, the parameter $y$ is at least 0.10 or at least 0.12. Alternatively or in addition, the parameter $y$ amounts to at most 0.25 or at most 0.20 or at most 0.18.

According to at least one embodiment of the method, the parameters $y1$ and $y4$ each vary along the growth direction over the first and fourth barrier layers by at least 0.02 or by at least 0.03 or by at least 0.04. Alternatively or in addition, this variation amounts to at most 0.07 or at most 0.06.

According to at least one embodiment, the indium content in each case varies monotonically or strictly monotonically along the growth direction in the first and fourth barrier layers. The reduction and increase in the indium content in the first and fourth barrier layers may alternatively also be determined with a mean straight line in respect of an actual profile of the indium content.

According to at least one embodiment, a growth rate during growth of the quantum well layer and/or during growth of the barrier layers amounts to at most 0.03 nm/s or at most 0.02 nm/s. Growth then proceeds comparatively slowly.

According to at least one embodiment of the method, a ratio of the flow rate of the reactant gas for N and a flow rate of reactant gases for elements from group 13 of the periodic table of elements, i.e. in particular for indium and gallium, is at least 30,000 or at least 70,000 or at least 100,000. The reactant gases are for example trimethylgallium or triethylgallium for gallium, or trimethylindium or triethylindium for indium. Trimethylaluminium or triethylaluminium are examples which may be used for aluminium. Group 13 of the periodic table of elements used also to be known as group III.

According to at least one embodiment, a growth temperature during growth at least of the first and fourth barrier layers is elevated relative to a growth temperature during growth of the quantum well layer. For example, this temperature increase amounts to more than 0° C. or at least 1° C. or at least 10° C. or at least 15° C. Alternatively or in addition, this temperature increase amounts to at most 100° C. or at most 60° C. or at most 40° C.

According to at least one embodiment, the growth temperatures for the layers of the active zone are in each case at least 730° C. or at least 750° C. Alternatively or in addition, the growth temperature amounts to at most 850° C. or at most 810° C.

According to at least one embodiment, the parameters $x1$ and $x4$ are each greater than 0. In other words, the first and fourth barrier layers are then based on AlInGaN. Addition of reactant gases for Al on the one hand and for Ga and/or In on the other preferably proceeds with a time offset. The reactant gas for nitrogen is preferably added continuously. In other words, the reactant gas for aluminium is not added at the same time as the reactant gases for gallium and indium. In particular, in each case precisely one of the reactant gases for the group 13 elements is added during growth. An interval of time of between 1 s and 2 s inclusive, in particular of at most 10 s or of at most 20 s is preferably left between the addition of the individual reactant gases for Ga, In and Al. This interval of time preferably corresponds at most to the time necessary on average for the growth of a single atomic layer.

According to at least one embodiment, $O_2$ or an oxygen compound is added during growth of the first and fourth barrier layers. In particular, an oxygen compound is added which provides atomic and/or reactive oxygen. Such an oxygen compound may simultaneously serve as a reactant gas for aluminium. For example, said compound is diethylaluminium ethoxide or a mixture of $N_2$ and $O_2$. An oxygen concentration is preferably ≤10%, in particular ≤0.1% in the doping region.

According to at least one embodiment of the method, the quantum well layers are designed to exhibit an emission wavelength of at least 435 nm and/or of at most 475 nm or of at most 545 nm.

An optoelectronic semiconductor chip is additionally provided. The semiconductor chip is produced using a method as indicated in conjunction with one or more of the above-stated embodiments. Features of the method are therefore also disclosed for the semiconductor chip and vice versa.

In at least one embodiment of the semiconductor chip, the third barrier layer has a higher GaN crystal quality than the second barrier layer. Alternatively or in addition, indium contamination is lower in the third barrier layer than in the second barrier layer.

The third barrier layer has an elevated quality as a result of the $H_2$ addition. For the second barrier layer it is particularly preferable for no $H_2$ addition to take place, since this might impair the material quality of the quantum well layers, in particular the quantum well layer grown directly beforehand. One effect of the addition of $H_2$ is the removal of In from the growth reactor and thus the suppression of undesired incorporation of In into the third barrier layer.

As a result of the additional In contribution in the first and fourth barrier layers, the material quality in these layers may deteriorate; however adjustment takes place to the In content of the quantum well layers. Because the third barrier layer is grown with the addition of $H_2$ and thus with a high quality, a quality of the In-containing layers grown thereafter is also brought about which leads in particular to high-quality InGaN barrier layers.

A method described here and an optoelectronic semiconductor chip described here will be explained in greater detail below with reference to the drawings and with the aid of exemplary embodiments. Elements which are the same in the individual figures are indicated with the same reference numerals. The relationships between the elements are not shown to scale, however, but rather individual elements may be shown exaggeratedly large to assist in understanding.

Figure 2:
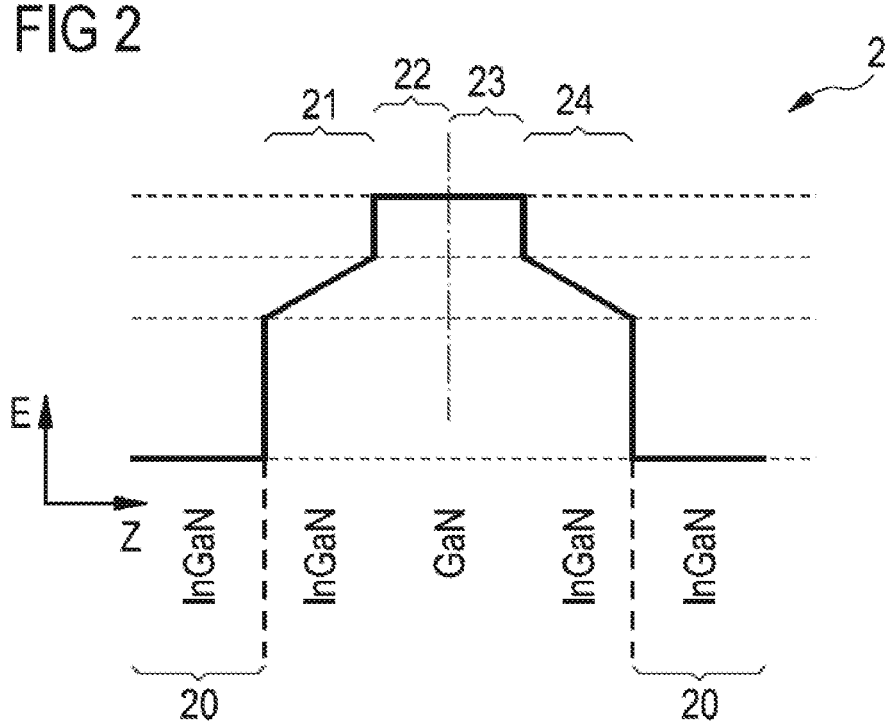
Figure 3:
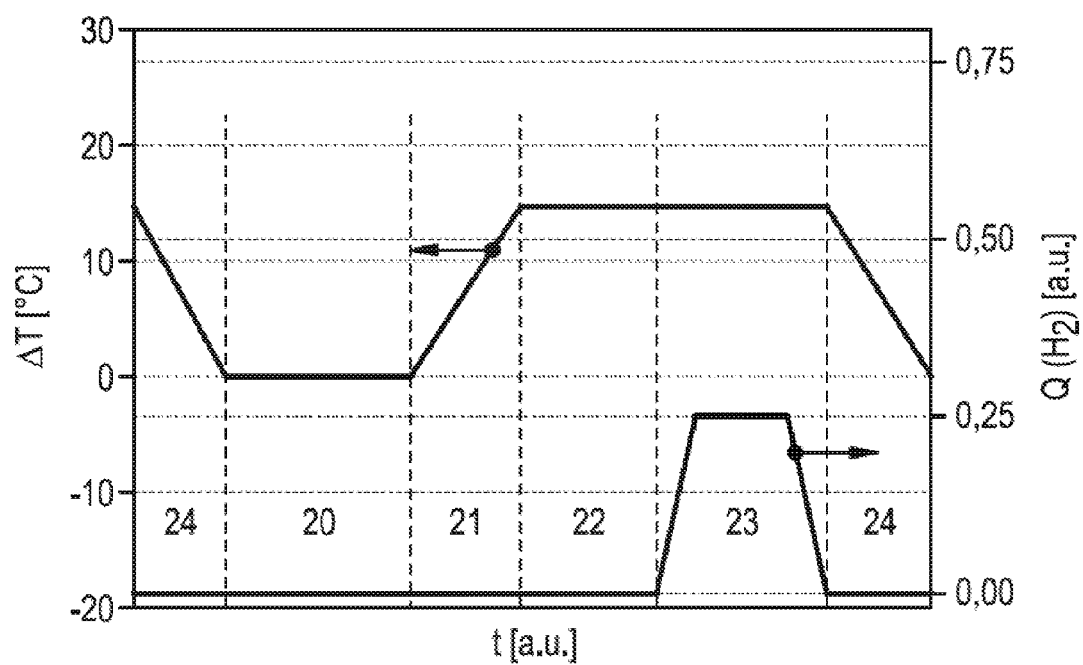

In the drawings:

FIG. 1 is a schematic sectional representation of an exemplary embodiment of an optoelectronic semiconductor chip described here, FIG. 2 is a schematic representation of an active zone for a semiconductor chip described here, and FIG. 3 is a diagram of the course of a method described here.

FIG. 1 is a schematic representation of an exemplary embodiment of an optoelectronic semiconductor chip 1 with an active zone 2. The semiconductor chip 1 comprises a superlattice 3 of alternating layers of GaN and InGaN, not shown separately. The top layer of the superlattice is formed by GaN.

The superlattice 3 is followed in a growth direction z by a fourth barrier layer 24 of InGaN. This fourth barrier layer 24 is followed by a quantum well layer 20 for generating an electromagnetic radiation when the semiconductor chip 1 is in operation. The quantum well layer 20 is followed by a first barrier layer 21, based on InGaN. This is followed by a second barrier layer 22 and a third barrier layer 23, each based on GaN. This sequence of layers repeats several times within the active zone 2. The top layer of the active zone 2, viewed in the growth direction z, in particular forms one of the third barrier layers 23.

The active zone 2 is illustrated in FIG. 2 by a profile of the band gap E as a function of the position along the growth direction z. The four barrier layers 21, 22, 23, 24 are located between two adjacent quantum well layers 20. Layers 21, 24 display a gradient in terms of the indium content. In the direction away from the quantum well layers 20, the indium content decreases in each case, for example from around 10% to around 5%. Unlike in the illustration, the barrier layers 21, 24 may also be based on AlInGaN.

The InGaN barrier layers 21, 24 up- and downstream of the quantum well layers 20 are preferably symmetrical relative to the geometric centre of the entire barrier, composed of the layers 21, 22, 23, 24. However, the first and fourth barrier layers 21, 24 may also be grown asymmetrically relative to the barrier centre. The thickness of the first and fourth barrier layers 21, 24 is preferably at most 1 nm or at most 3 nm.

A GaN barrier region, composed of the second and third barrier layers 22, 23, preferably has a thickness of ≤3 nm or ≤2.2 nm. For example, this GaN barrier region has an average thickness of roughly 1.5 nm or of roughly 2.1 nm.

In FIG. 3 a method for producing the optoelectronic semiconductor chip 1 is plotted using a temperature profile and using a volumetric gas flow rate Q or flow rate of $H_2$ gas in each case as a function of time t. The temperature is here stated as the temperature change ΔT in ° C. and related to a growth temperature for the quantum well layer 20.

FIG. 3 shows that the quantum well layer 20 is grown at a temperature roughly 15° C. lower than the second and third barrier layers 22, 23. During growth of the first and fourth barrier layers 21, 24 a temperature change takes place in each case, in particular a temperature adjustment in the form of a ramp.

As also in all the other exemplary embodiments, it is possible, unlike in the representation according to FIG. 2, for the indium content in the first and fourth barrier layers 21, 24 to be reduced continuously or in stages to zero from the indium content of the quantum well layers 20 to the barrier layers 22, 23. The indium content gradient is adjustable for example via a growth temperature for the first and fourth barrier layers 21, 24 or indeed via the flow rate of reactant for indium.

Unlike in FIG. 3, it is likewise possible for the barrier layers 21, 22, 23, 24 and the quantum well layers 20 to be grown at the same temperature within the bounds of manufacturing tolerances.

FIG. 3 further illustrates that $H_2$ is added during growth of the third barrier layer 23 based on GaN. In this way, residues of indium can be removed from a growth surface and a particularly high quality third barrier layer 23 may be produced.

Particularly preferably, the inflow of reactant gases for indium is stopped during growth of the second and third barrier layers 22, 23. In particular, no reactant for indium is supplied while hydrogen gas is being supplied. The $H_2$ flow rate is, in each case with a tolerance of at most three percentage points, for example ⅙, ⅕, ¼, ⅓ or half of the flow rate of the reactant gas for N, which is preferably $NH_3$. In an alternative embodiment, it is possible, unlike as is shown in FIG. 3, to supply the hydrogen gas throughout the growth of the second and third barrier layers 22, 23.

During deposition of the GaN layers 22, 23 a ratio between the flow rates of the reactant gases for N and for the elements from group 13 of the periodic table of elements is preferably at least 100,000.

If AlInGaN is used instead of InGaN for the first and fourth barrier layers 21, 24, the reactant gases for the individual elements from group 13 of the periodic table of elements are preferably not passed simultaneously into an epitaxy reactor. A source of the reactant gas for N preferably remains permanently open.

The reactant gases for the group 13 elements may be provided in pulsed manner. The following is for example conceivable as a pulse sequence for the reactant gases: Al x*(In—Ga), wherein x is preferably a number between 1 and 5 inclusive. A pulse of an aluminium reactant gas is thus followed for example by three pulses of an indium reactant gas and three pulses of a gallium reactant gas. Between the aluminium pulse and the indium pulse there is a growth interval of between 0 s and 10 s inclusive, preferably between 1 s and 2 s inclusive. The individual pulses preferably have a duration of ≤10 s, in particular between 1 s and 2 s inclusive.

A growth rate for the first and fourth barrier layers 21, 24 then preferably amounts to roughly 0.02 nm/s and the N to group 13 reactant gas flow rate ratio is in particular at least 40,000. The Al concentration is for example between 0.01% and 40% inclusive, and the In concentration is preferably at least 1% and/or at most 40%.

Deposition of the AlInGaN layers 21, 24 may take place with the addition of oxygen, in order to influence the binding of indium atoms to aluminium atoms in such a way that the AlInGaN material quality is influenced in a sustainably positive manner. Oxygen concentration is then for example ≤0.1% or ≤10%.

The active zone is for example constructed as follows and produced as follows:

Five quantum well layers 20 are deposited at a temperature of 770° C. for a wavelength to be generated of 450 nm. A growth rate amounts to 0.014 nm/s. The reactant gas ratio for N and the group 13 elements is 30,000. The quantum well layers 20 each have a thickness of roughly 3.3 nm.

The InGaN barrier layers 21, 24 have on average an indium concentration of 7.5%. The growth temperature for the first and fourth barrier layers 21, 24 is between the growth temperature for the second and third barrier layers 22, 23 and the growth temperature of the quantum well layers 20. The barrier layers 21, 24 are grown symmetrically in the growth direction z up- and downstream of the quantum well layers 20. The barrier layers 21, 24 each have an average thickness of roughly 0.75 nm.

The thickness of the GaN barrier region, composed of the barrier layers 22, 23, is roughly 1.5 nm. This GaN barrier region is grown when supply of the reactant for indium is stopped. After ⅓ of the growth of this GaN barrier region, hydrogen gas is fed into the reactor. The hydrogen gas flow rate is geared to the $NH_3$ gas flow rate and amounts to roughly ¼ thereof. During growth of the GaN barrier region, the reactant flow rate ratio for N and the group 13 elements is 110,000. The GaN barrier region is deposited at the same growth temperature as the quantum well layers 20 or at a temperature around 20° C. higher.

The barrier layers 21, 22, 23, 24 together with the quantum well layer 20 have a superlattice thickness of roughly 7.0 nm.

According to a further example, the semiconductor chip is constructed as follows and grown as follows:

The quantum well layers are grown as in the preceding example. The GaN barrier layers 22, 23 are likewise grown as indicated in the preceding example.

The first and fourth barrier layers 21, 24 are based on AlInGaN and the Al content is roughly equal to the In content and may be around 30%. The barrier layers 21, 24 are grown at a temperature which is roughly 15° C. higher than the growth temperature of the quantum well layers 20. The AlInGaN barrier layers 21, 24 are grown symmetrically relative to the GaN region composed of layers 22, 23. The barrier layers 21, 24 have a thickness of in each case roughly 0.75 nm. Optionally, oxygen may be added during growth of the barrier layers 21, 24.

The invention described here is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

This patent application claims priority from German patent application 10 2012 104 671.9, the disclosure content of which is hereby included by reference.

The invention claimed is:

1. Method for producing an active zone for an optoelectronic semiconductor chip, having the steps:
   growing a fourth barrier layer based on $Al_{x4}In_{y4}Ga_{1-x4-y4}N$ where $0 \leq x4 \leq 0.40$ and on average $0 < y4 \leq 0.4$, wherein the In content increases along a growth direction,
   growing a quantum well layer on the fourth barrier layer, wherein the quantum well layer is based on $In_yGa_{1-y}N$ where $0.08 \leq y \leq 0.35$,
   growing a first barrier layer based on $Al_{x1}In_{y1}Ga_{1-x1-y1}N$ where $0 \leq x1 \leq 0.40$ and on average $0 < y1 \leq 0.4$ onto the quantum well layer, wherein the In content decreases along the growth direction,
   growing a second barrier layer based on GaN onto the first barrier layer, and
   growing a third barrier layer based on GaN onto the second barrier layer,
   wherein exclusively the third barrier layer is grown with the addition of $H_2$ gas.

2. Method according to claim 1, in which said layers are grown directly onto one another in the stated sequence, wherein this sequence is repeated between 3 and 10 times inclusive in the active zone.

3. Method according to claim 1, in which an $H_2$ flow rate during growth of the third barrier layer is between 15% and 55% inclusive of a flow rate of a reactant gas for N.

4. Method according to claim 1, in which the first and fourth barrier layers are each grown with an average thickness of between 0.6 nm and 1.8 nm inclusive.

5. Method according to claim 1, in which the second and third barrier layers are each grown with an average thickness of between 0.6 nm and 1.8 nm inclusive,
   wherein the third barrier layer is grown with a larger average thickness than the second barrier layer.

6. Method according to claim 1, in which the quantum well layer is grown with an average thickness of between 2.5 nm and 4.0 nm inclusive,
   wherein a total thickness of the quantum well layer and the barrier layers is between 5.5 nm and 8.5 nm inclusive.

7. Method according to claim 1, wherein
   $x4 \leq 0.02$,
   on average $0.04 < y4 \leq 0.11$,
   $0.12 \leq y \leq 0.18$,
   $x1 \leq 0.02$, and
   on average $0.04 < y1 \leq 0.11$.

8. Method according to claim 1, in which y1 and y4 each vary along the growth direction over the first and fourth barrier layers by at least 0.03 and by at most 0.07.

9. Method according to claim 1, in which y1 decreases monotonically along the growth direction and y4 increases monotonically along the growth direction.

10. Method according to claim 1, in which at least during growth of the quantum well layer
    a growth rate amounts to at most 0.03 nm/s, and
    a ratio of a flow rate of a reactant gas for N and a flow rate of reactant gases for elements from group 13 of the periodic table of elements is at least 30,000.

11. Method according to claim 1, in which a growth temperature during growth of at least the first and fourth barrier layers is increased by at least 12° C. and by at most 40° C. relative to a growth temperature for the quantum well layer, wherein the growth temperatures are in each case between 730° C. and 850° C. inclusive.

12. Method according to claim 1, in which x1>0 and x4>0,
    wherein during growth of the first and fourth barrier layers
    an interval of time of at least 1 s is left between the addition of the reactant gas for Al and the addition of the reactant gases for In and Ga, and
    $O_2$ or an oxygen compound is present.

13. Method according to claim 1, in which the quantum well layer is designed for an emission wavelength of between 435 nm and 545 nm inclusive.

14. Optoelectronic semiconductor chip with an active zone which is produced using a method according to claim 1, wherein the third barrier layer has a higher GaN crystal quality than the second barrier layer.

15. Method according to claim 10, in which the group 13 elements are at least In and Ga.

16. Method for producing an active zone for an optoelectronic semiconductor chip, having the steps:
    growing a fourth barrier layer based on $Al_{x4}In_{y4}Ga_{1-x4-y4}N$ where $0 \leq x4 \leq 0.40$ and on average $0 < y4 \leq 0.4$, wherein the In content increases along a growth direction,
    growing a quantum well layer on the fourth barrier layer, wherein the quantum well layer is based on $In_yGa_{1-y}N$ where $0.08 \leq y \leq 0.35$,
    growing a first barrier layer based on $Al_{x1}In_{y1}Ga_{1-x1-y1}N$ where $0 \leq x1 \leq 0.40$ and on average $0 < y1 \leq 0.4$ onto the quantum well layer, wherein the In content decreases along the growth direction,
    growing a second barrier layer based on GaN onto the first barrier layer, and
    growing a third barrier layer based on GaN onto the second barrier layer,
    wherein exclusively the third barrier layer is grown with the addition of $H_2$ gas,
    wherein there is a step in a profile of a band gap as a function of a position along the growth direction between the fourth barrier layer and the quantum well layer, between the quantum well layer and the first barrier layer, between the first barrier layer and the second barrier layer, and between the third barrier layer and the fourth barrier layer, and
    wherein a total thickness of the quantum well layer and the first, second, third and fourth barrier layers is between 5.5 nm and 8.5 nm inclusive.

17. Method according to claim 16, wherein the band gap in the quantum well layer is constant,
    wherein the band gap in the second and third barrier layers is constant with no step in the band gap between the second and third barrier layers, and
    wherein the band gap in the first and second barrier layers linearly increases in a direction away from the quantum well layer.

18. Method according to claim 17, wherein a growth temperature during growth of at least the first and fourth barrier layers is increased by at least 10° C. and by at most 60° C. relative to a growth temperature for the quantum well layer, and
    wherein the growth temperatures are in each case between 730° C. and 850° C. inclusive.

* * * * *